United States Patent
Haroun et al.

(10) Patent No.: US 8,970,411 B2
(45) Date of Patent: Mar. 3, 2015

(54) PIPELINED CONTINUOUS-TIME SIGMA DELTA MODULATOR

(75) Inventors: Baher S. Haroun, Allen, TX (US);
Venkatesh Srinivasan, Dallas, TX (US);
Patrick Satarzadeh, Addison, TX (US);
Marco Corsi, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 267 days.

(21) Appl. No.: 13/601,795

(22) Filed: Aug. 31, 2012

(65) Prior Publication Data
US 2012/0326906 A1 Dec. 27, 2012

Related U.S. Application Data

(63) Continuation of application No. 12/899,205, filed on Oct. 6, 2010, now Pat. No. 8,284,085.

(51) Int. Cl.
*H03M 3/00* (2006.01)

(52) U.S. Cl.
CPC .............. *H03M 3/344* (2013.01); *H03M 3/458* (2013.01)
USPC ........................... 341/143; 341/155; 341/144

(58) Field of Classification Search
USPC ......................................... 341/143, 155, 161
See application file for complete search history.

(56) References Cited

U.S. PATENT DOCUMENTS

| | | | |
|---|---|---|---|
| 5,729,230 A | 3/1998 | Jensen et al. | |
| 6,271,782 B1 | 8/2001 | Steensgaard-Madsen | |
| 6,496,128 B2 * | 12/2002 | Wiesbauer et al. | 341/143 |
| 6,788,232 B1 | 9/2004 | Lee | |
| 7,006,024 B2 | 2/2006 | Keaveney et al. | |
| 7,348,906 B2 | 3/2008 | O'Donnell et al. | |
| 7,460,046 B2 | 12/2008 | Di Giandomenico et al. | |
| 7,486,214 B1 | 2/2009 | Di Giandomenico et al. | |
| 7,557,742 B2 | 7/2009 | Kulinets et al. | |
| 7,973,689 B2 * | 7/2011 | Glass et al. | 341/143 |
| 8,212,699 B1 * | 7/2012 | Nilsson et al. | 341/143 |
| 8,284,085 B2 | 10/2012 | Haroun et al. | |
| 8,421,660 B1 * | 4/2013 | Wan et al. | 341/143 |
| 2004/0034499 A1 | 2/2004 | Regier | |

FOREIGN PATENT DOCUMENTS

| | | |
|---|---|---|
| EP | 0338358 | 10/1989 |
| WO | WO04001977 | 12/2003 |

OTHER PUBLICATIONS

PCT Search Report from U.S. Appl. No. 12/899,205, mailed Apr. 18, 2012.

* cited by examiner

*Primary Examiner* — Brian Young
(74) *Attorney, Agent, or Firm* — Alan A. R. Cooper; Frederick J. Telecky, Jr.

(57) ABSTRACT

Traditionally, pipelined continuous-time (CT) sigma-delta modulators (SDM) have been difficult to build due at least in part to the difficulties in calibrating the pipeline. Here, however, a pipelined CT SDM is provided that has an architecture that is conducing to being calibrated. Namely, the system includes a digital filter and other features that can be adjusted to account for input imbalance errors and well as quantization leakage noise.

19 Claims, 2 Drawing Sheets

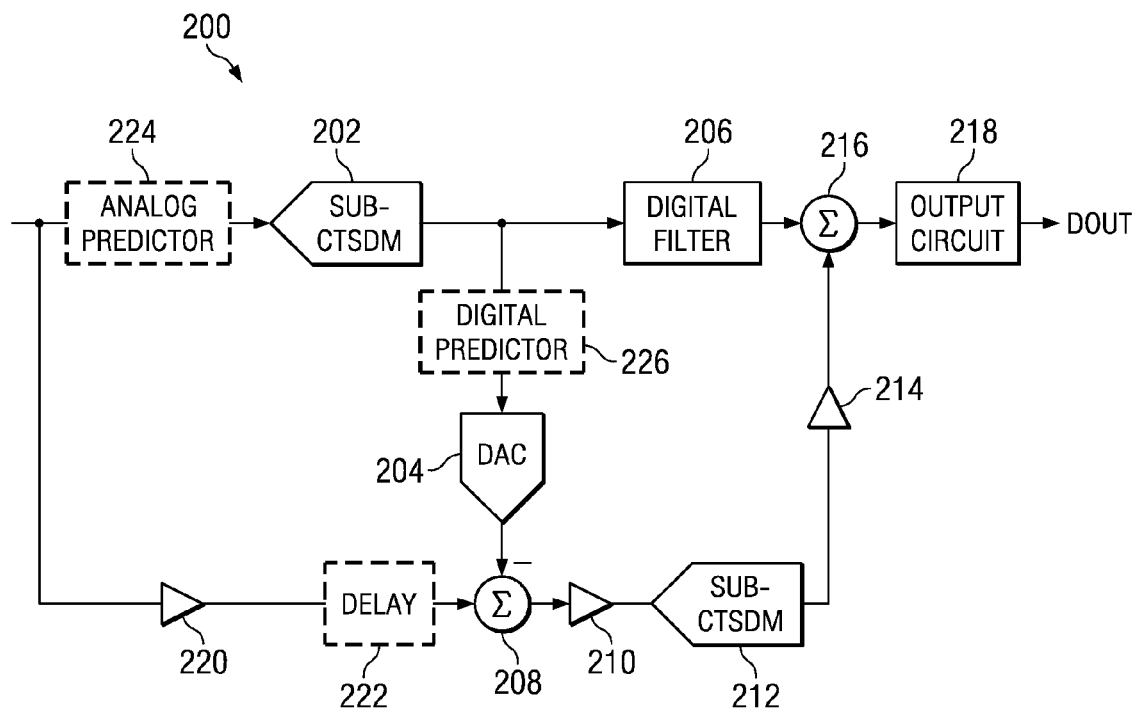
FIG. 2
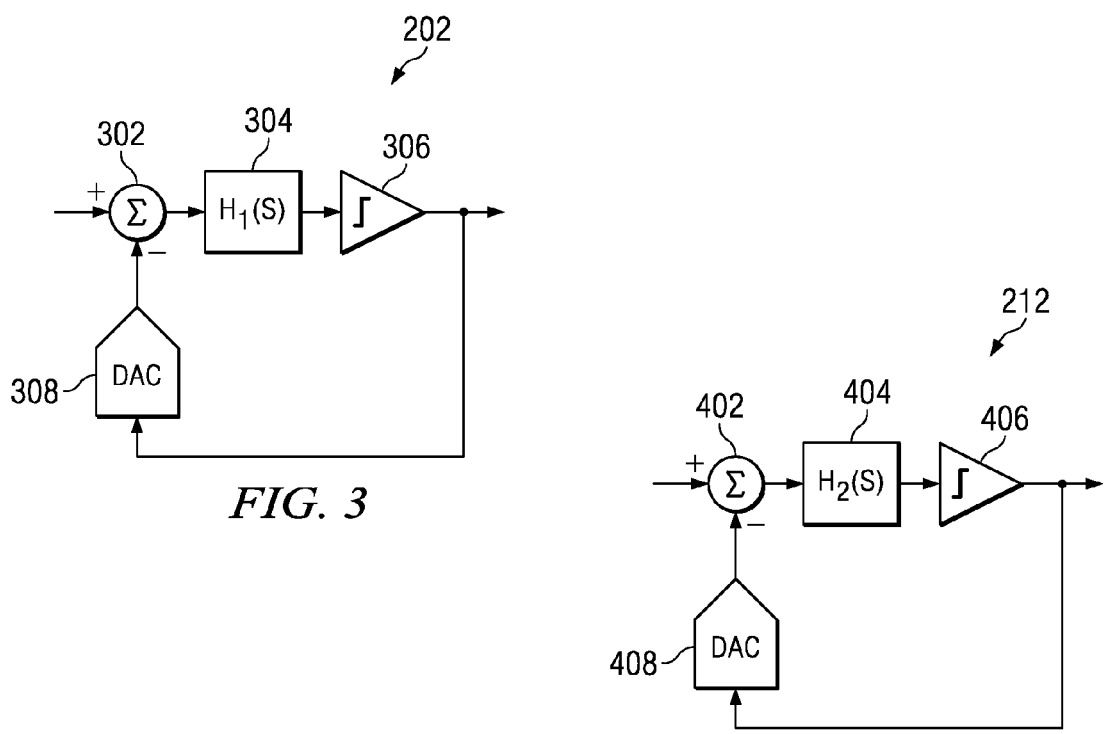
FIG. 3
FIG. 4

US 8,970,411 B2

PIPELINED CONTINUOUS-TIME SIGMA DELTA MODULATOR

CROSS-REFERENCE TO RELATED APPLICATIONS

This application is a continuation of U.S. patent application Ser. No. 12/899,205, entitled "PIPELINED CONTINUOUS-TIME SIGMA DELTA MODULATOR, filed Oct. 6, 2010 which is related to co-pending U.S. patent application Ser. No. 12/899,158, entitled "METHOD FOR CALIBRATING A PIPELINED CONTINUOUS-TIME SIGMA DELTA MODULATOR," filed Oct. 6, 2010. Each of these applications is hereby incorporated by reference for all purposes.

TECHNICAL FIELD

The invention relates generally to data converters and, more particularly, to continuous-time (CT) sigma-delta modulators (SDMs) or sigma-delta analog-to-digital converters (ADCs).

BACKGROUND

Referring to FIG. 1 of the drawings, the reference numeral 100 generally designates a pipelined discrete-time (DT) SDM. With a DT data converter, an analog input signal (such as signal AIN) is sampled by a sample-and-hold (S/H) circuit (such as S/H circuit 102) at discrete points in time or sampling instants, and the samples are converted to digital. Here, two SDM stages 104-1 and 104-2 are used in a pipeline configuration to perform the conversion for each of the samples. Each of stages 104-1 and 104-2 respectively comprise summing circuits 116-1/118-1 or 116-2/118-2, a delay 120-1 or 120-2, quantizer 122-1 or 122-2, digital low pass filter (LPF) 124-1 or 124-2, and digital-to-analog converter (DAC) 128-1 or 128-2. Additionally, stage 104-1 also includes digital filter 126. Between stages 104-1 and 104-2, there are several other components that enable stages 104-1 and 104-2 to operate as a pipeline; namely, these components are delay 108, summing circuit 110, amplifiers 112 and 114, analog LPF 113, and digital output circuit 106.

In operation, DT SDM 100 converts the analog input signal AIN to digital output signal DOUT. To accomplish this, a sample of the analog input signal AIN is provided to stage 104-1 (by S/H circuit 102), where the sample is converted to digital using conventional sigma-delta modulation. The same sample is provided to delay 108 so as to provide stage 104-1 with sufficient time to perform the data conversion. The difference analog representation of the data conversion (from DAC 128-1) and the sampled analog input signal AIN (from delay 108) or residue is determined by summing circuit 110. This residue is amplified and filtered by amplifiers 112 and 114 and analog LPF 113 and provided to stage 104-2. Stage 104-2 can then convert the residue to digital using conventional sigma-delta modulation. The digital output circuit 106 then generates the digital output signal DOUT based on the output from each pipeline 104-1 and 104-2.

This architecture, however, is incompatible with CT sigma-delta modulation. With DT sigma-delta modulation, the input to the stages (i.e., stages 104-1 and 104-2) is constant during conversion because the S/H circuit 102 holds the sampled analog input signal AIN. In contrast, an input to stages of a pipeline would be varying. Looking to DT SDM 100, it specifically employs a delay 108 so that stages 104-1 and 104-2 perform sigma-delta modulation on the same sample. If one were to remove the S/H circuit 102 so as to provide a continuously varying signal (i.e., analog input signal AIN) directly to stage 104-1 and delay 108, DT SDM 100 would not function.

Some other conventional circuits are: U.S. Pat. No. 5,729,230; U.S. Pat. No. 6,788,232; U.S. Pat. No. 7,460,046; U.S. Pat. No. 7,486,214.

SUMMARY

A preferred embodiment of the present invention, accordingly, provides an apparatus. The apparatus comprises a first continuous-time (CT) sigma-delta modulator (SDM) that receives an analog input signal; a digital-to-analog converter (DAC) that is coupled to the first CT SDM; a first summing circuit that receives the analog input signal and that is coupled to the DAC, wherein the first summing circuit determines a difference between the analog input signal and an output from the DAC; an amplifier that is coupled to the summing circuit, wherein the amplifier has a first gain, and wherein the amplifier includes a filter; a second CT SDM that is coupled to the amplifier; a digital gain circuit that is coupled to the second CT SDM, wherein the digital gain circuit has a second gain, and wherein the second gain is substantially the inverse of the first gain, and wherein the amplifier, the second CT SDM, and the DAC collectively have a first transfer function; a digital filter that is coupled to the first CT SDM, wherein the digital filter has a second transfer function, wherein the second transfer function substantially matches the first transfer function; and a second summing circuit that is coupled to the digital filter and the digital gain circuit.

In accordance with a preferred embodiment of the present invention, the DAC further comprises a first DAC having a third gain, and wherein the digital filter has a fourth gain, and wherein the second CT SDM further comprises: a third summing circuit that is coupled to the amplifier; an SDM filter that is coupled to the third summing circuit; a quantizer that is coupled to the SDM filter; and a second DAC that is coupled to the quantizer and the third summing circuit, wherein the third summing circuit determines a difference between an output of the amplifier and an output of the second DAC, and wherein the second DAC has a fifth gain, and wherein the ratio of the third gain to the fifth gain is approximately equal to the fourth gain.

In accordance with a preferred embodiment of the present invention, the SDM filter and the quantizer further comprise a first SDM filter and a first quantizer, and wherein the first CT SDM further comprises: a fourth summing circuit that receives the analog input signal; a second SDM filter that is coupled to the fourth summing circuit; a second quantizer that is coupled to the second SDM filter; and a second DAC that is coupled to the second quantizer and the fourth summing circuit, wherein the fourth summing circuit determines a difference between the analog input signal and an output of the second DAC.

In accordance with a preferred embodiment of the present invention, the apparatus further comprises: an analog delay line that receives the analog input signal is coupled to the first summing circuit; and a digital predictor that is coupled between the first CT SDM and the first DAC.

In accordance with a preferred embodiment of the present invention, the apparatus further comprises an analog predictor that receives the analog input signal and that is coupled to the fourth summing circuit.

In accordance with a preferred embodiment of the present invention, the amplifier further comprises a first amplifier, and wherein the apparatus further comprises a second amplifier that is coupled to the first summing circuit and that receives the analog input signal.

In accordance with a preferred embodiment of the present invention, the second amplifier has a third gain, and wherein the third gain is dimensioned to minimize an autocorrelation of an output of the second CT SDM.

In accordance with a preferred embodiment of the present invention, the apparatus further comprises an output circuit that is coupled to the second circuit and that provides a digital output signal.

In accordance with a preferred embodiment of the present invention, an apparatus is provided. The apparatus comprises an input terminal; a first stage of a pipeline including: a first CT SDM that is coupled to the input terminal; and a digital filter that is coupled to the first CT SDM, wherein the digital filter has a first transfer function; a second stage of a pipeline including: a first summing circuit that is coupled to the input terminal, wherein the first summing circuit is adapted to determine a difference; an amplifier that is coupled to the first summing circuit, wherein the amplifier has a first gain, and wherein the amplifier includes a filter; a second CT SDM that is coupled to the first amplifier; and a digital gain circuit that is coupled to the second CT SDM, wherein the digital gain circuit has a second gain that is an inverse of the first gain; a DAC that is coupled between the first CT SDM and the first summing circuit, wherein the amplifier, the DAC, and the second CT SDM collectively have a second transfer function; and a second summing circuit that is coupled to each stage of the pipeline, wherein the first transfer function is adjusted to substantially match the second transfer function.

In accordance with a preferred embodiment of the present invention, the DAC further comprises a first DAC having a third gain, and wherein the digital filter has a fourth gain, and wherein the second CT SDM further comprises: a third summing circuit that is coupled to the amplifier; an SDM filter that is coupled to the third summing circuit; a quantizer that is coupled to the SDM filter; and a second DAC that is coupled to the quantizer and the third summing circuit, wherein the third summing circuit determines a difference between an output of the amplifier and an output of the second DAC, and wherein the second DAC has a fifth gain, and wherein the ratio of the third gain to the fifth gain is approximately equal to the fourth gain.

In accordance with a preferred embodiment of the present invention, the SDM filter and the quantizer further comprise a first SDM filter and a first quantizer, and wherein the first CT SDM further comprises: a fourth summing circuit that receives the analog input signal; a second SDM filter that is coupled to the fourth summing circuit; a second quantizer that is coupled to the second SDM filter; and a second DAC that is coupled to the second quantizer and the fourth summing circuit, wherein the fourth summing circuit determines a difference between the analog input signal and an output of the second DAC.

In accordance with a preferred embodiment of the present invention, the amplifier further comprises a first amplifier, and wherein the apparatus further comprises a second amplifier that is coupled to the first summing circuit and that receives the analog input signal.

In accordance with a preferred embodiment of the present invention, the second amplifier has a third gain, and wherein the third gain is adjusted by the controller to minimize an autocorrelation of an output of the second CT SDM.

In accordance with a preferred embodiment of the present invention, the apparatus further comprises an output circuit that is coupled to the second circuit and that provides a digital output signal.

In accordance with a preferred embodiment of the present invention, an apparatus is provided. The apparatus comprises an input terminal that receives an analog input signal; a first stage of a pipeline including: a first CT SDM including: a first summing circuit that is coupled to the input terminal so as to receive the analog input signal; a first SDM filter that is coupled to the first summing circuit; a first quantizer that is coupled to the first SDM filter; and a first DAC that is coupled to the first quantizer and the first summing circuit, wherein the first summing circuit determines a difference between the analog input signal and an output of the second DAC; and a digital filter that is coupled to the first CT SDM, wherein the digital filter has a first transfer function; a second stage of a pipeline including: a first amplifier that is coupled to the input terminal so as to receive the analog input signal, wherein the first amplifier has a first gain; a second summing circuit that is coupled to the first amplifier, wherein the second summing circuit is adapted to determine a difference; a second amplifier that is coupled to the second summing circuit, wherein the second amplifier has a second gain, wherein the second amplifier includes a filter; a second CT SDM having: a third summing circuit that is coupled to the second amplifier; a second SDM filter that is coupled to the third summing circuit; a second quantizer that is coupled to the second SDM filter; and a second DAC that is coupled to the second quantizer and the third summing circuit, wherein the third summing circuit determines a difference between an output of the second amplifier and an output of the second DAC; and a digital gain circuit that is coupled to the second CT SDM, wherein the third amplifier has a third gain that is an inverse of the second gain; a third DAC that is coupled between the first CT SDM and the second summing circuit, wherein the third DAC, the second CT SDM, and the second amplifier collectively have a second transfer function; a fourth summing circuit that is coupled to each stage of the pipeline, wherein the first transfer function is adjusted to substantially match the second transfer function, and wherein the first gain is adjusted to minimize an autocorrelation of an output of the second CT SDM, and wherein a gain of the digital filter to be approximately equal to a ratio of the gains of the second and third DACs; and an output circuit that is coupled to the fourth summing circuit and that provides a digital output signal.

In accordance with a preferred embodiment of the present invention, a method for calibrating at least a portion of a pipelined continuous-time (CT) sigma-delta modulator (SDM) is provided. The CT SDM includes a first stage, a second stage, and a first digital-to-analog converter (DAC) coupled between the first and second stages, and a digital filter that is coupled to the first and second stages, and wherein the second stage includes a second DAC. The method comprises determining a ratio of a gain of the first DAC to a gain of the second DAC; adjusting a gain of a digital filter to be approximately equal to the ratio of the gain of the first DAC to the gain of the second DAC; and adjusting the digital filter to maximize a cross-correlation between an output of the digital filter and the output of the second stage.

In accordance with a preferred embodiment of the present invention, the method further comprises: disabling the first DAC, wherein the first DAC is located between a first stage and a second stage of the pipelined CT SDM; applying a predetermined input signal to the second stage while the first DAC is disabled; enabling the first DAC; disabling the second DAC within the second stage; and applying the predetermined input signal to the second stage while the using the first DAC as a feedback DAC for the second stage.

In accordance with a preferred embodiment of the present invention, the method further comprises determining a gain of an amplifier located in the second stage that minimizes an autocorrelation of an output of the second stage.

In accordance with a preferred embodiment of the present invention, a method for calibrating at least a portion of a pipelined CT SDM is provided. The method comprises disabling a first DAC, wherein the first DAC is located between the first stage and the second stage of the pipelined CT SDM; applying a predetermined input signal to the second stage while the first DAC is disabled; enabling the first DAC; disabling a second DAC within the second stage; applying the predetermined input signal to the second stage while the using the first DAC as a feedback DAC for the second stage; determining gains of the first and second DACs; and adjusting a gain of a digital filter to be a function of the gains of the first and second DACs.

In accordance with a preferred embodiment of the present invention, the digital filter is coupled to the first and second stages.

In accordance with a preferred embodiment of the present invention, the function is a ratio of the gains of the first and second DACs.

In accordance with a preferred embodiment of the present invention, the method further comprises determining a gain of an amplifier located in the second stage that minimizes an autocorrelation of an output of the second stage.

In accordance with a preferred embodiment of the present invention, the method further comprises adjusting the digital filter to maximize a cross-correlation between an output of the digital filter and the output of the second stage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a block diagram of an example of a pipelined CT SDM in accordance with a preferred embodiment of the present invention; and FIGS. 3 and 4 are block diagrams of examples of the sub-CT SDMs of FIG. 2.

DETAILED DESCRIPTION

Figure 1:
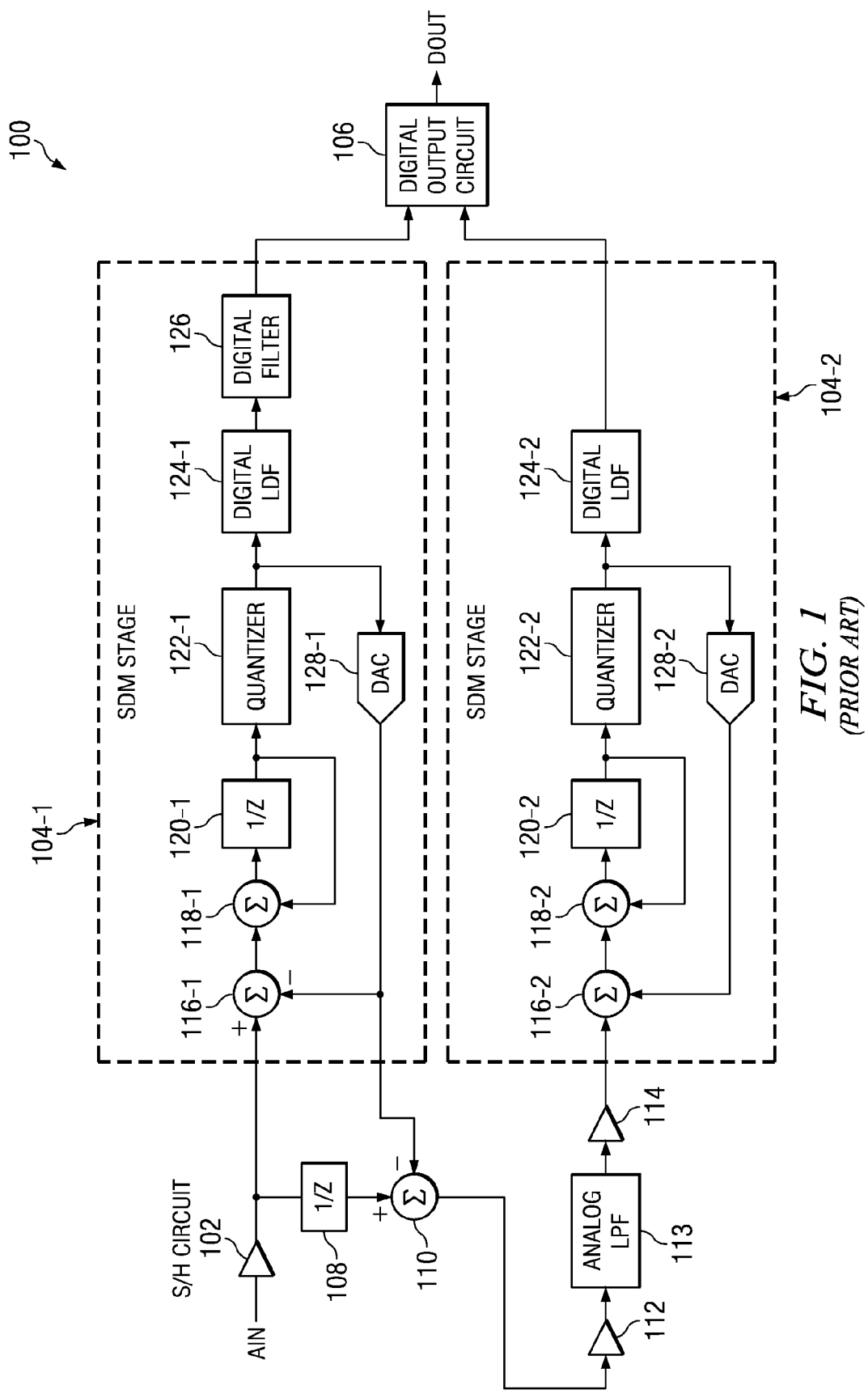
FIG. 1 is a block diagram of a conventional pipelined DT SDM.

Refer now to the drawings wherein depicted elements are, for the sake of clarity, not necessarily shown to scale and wherein like or similar elements are designated by the same reference numeral through the several views.

Turning to FIGS. 2-4, an example of a pipelined CT SDM 200 in accordance with a preferred embodiment of the present invention can be seen. As an example, CT SDM 200 is a two-stage pipeline; however, CT SDM 200 can be scaled to include more stages. In this example, CT SDM 200 generally comprises CT SDMs (or sub-CT SDMs) 202 and 212, DAC 204, digital filter 206, amplifiers 220 and 210, digital gain circuit 214, summing circuits 208 and 216, output circuit 218, and an adjustable delay 222. CT SDM 202 (which can be seen in FIG. 3) generally comprises summing circuit 302, SDM filter 304, quantizer 306, and DAC 308, and CT SDM 212 generally comprises summing circuit 402, SDM filter 404, quantizer 405, and DAC 408. Also, CT SDM 202 can be a lower order modulator (i.e., order of 1 or 2), while CT SDM 212 can be a higher order modulator (i.e., order greater than 3) with aggressive noise shaping. Moreover, amplifier 210 also includes a filter. Amplifiers 220 and 210 can take on many forms, including but not limited to voltage-to-voltage amplifiers (i.e., operational amplifiers), voltage-to-current amplifiers with a current gain (i.e, transconductance amplifiers or variable resistors), current-to-voltage amplifiers (i.e., transimpedance amplifiers), or current-to-current amplifiers (i.e., current mode amplifiers having a topology that depends on the input signal AIN).

In order for CT SDM to function, CT SDM 200 is generally calibrated to compensate for system mismatches, but to make any calibrations, the sources of mismatch and error should be identified. Each of DACs 204, 308, and 408 each have gains of $g_4$, $g_1$, and $g_2$, while amplifiers 220 and 210 and digital gain circuit 214 have gains of $g_3$, $g_5$, and $g_6$. Gain $g_6$ can be adjusted to be approximately equal to be the inverse of gain $g_5$ (or $g_6=1/g_5$), which generally eliminates the effect of amplifiers 210. Alternatively, the gain $g_5$ can be 1 so as to use the filter incorporated therein. Additionally, each of SDM filters 304 and 306 include a gain of $1/g_1$ and $1/g_2$, respectively, to compensate for the gains of their respective DACs 308 and 408, and digital filter 206 has a gain of $g_F$ and a transfer function of $C_F(z)$. As a result, the output $Y_1(z)$ (which is in the frequency domain or z-domain) from CT SDMs 202 is $$Y_1(z) = \frac{S_1(z)X(z)}{g_1} + N_1(z)Q_1(z), \tag{1}$$

where, $S_1(z)$ is the Signal Transfer Function (STF) and $N_1(z)$ is the Noise Transfer Function (NTF) of an equivalent Discrete-Time Sigma Delta Modulator to which the CT SDM 200 is mapped for purposes of analysis using techniques well known to those skilled in the art, $Q_1(z)$ is the quantization error of the quantizer and $X(z)$ is the discrete time equivalent of the continuous-time input. This leads to the output $Y_{1,N}(z)$ from digital filter 206 being:

$$Y_{1,N}(z) = Y_1(z)g_F C_F(z) \tag{2}$$
$$= \left(\frac{g_F}{g_1}\right)S_1(z)X(z)C_F(z) + g_F N_1(z)Q_1(z)C_F(z),$$

The input $R(z)$ into CT SDM 212 is a combination of the output from amplifier 220 and output $Y_1(z)$ yielding:

$$R(z) = g_3 X(z) - g_4 Y_1(z) \tag{3}$$
$$= g_3 X(z) - \left(\frac{g_4}{g_1}\right)S_1(z)X(z) - g_4 N_1(z)Q_1(z)$$

Now using the same rationale applied to CT SDM 202 (because the structures of CT SDMs 202 and 212 are similar), the output $Y_2(z)$ for CT SDM 212 is:

$$Y_2(z) = \frac{S_2(z)R(z)}{g_2} + N_2(z)Q_2(z) \qquad (4)$$

$$= \left(\frac{g_3}{g_2}\right)S_2(z)X(z) - \left(\frac{g_4}{g_1g_2}\right)S_2(z)S_1(z)X(z) -$$

$$\left(\frac{g_4}{g_2}\right)S_2(z)N_1(z)Q_1(z) + N_2(z)Q_2(z)$$

Thus, the output $Y(z)$ of CT SDM 200 should be:

$$Y(z) = Y_{1,N}(z) + Y_2(z) \qquad (5)$$

$$= \left(\frac{g_F}{g_1}\right)S_1(z)X(z)C_F(z) + N_2(z)Q_2(z) +$$

$$\left(\frac{g_3}{g_2}\right)S_2(z)X(z) - \left(\frac{g_4}{g_1g_2}\right)S_2(z)S_1(z)X(z) +$$

$$g_F N_1(z)Q_1(z)C_F(z) - \left(\frac{g_4}{g_2}\right)S_2(z)N_1(z)Q_1(z)$$

Equation (5) can then be reduced as follows:

$$Y(z) = \left(\frac{g_F}{g_1}\right)S_1(z)X(z)C_F(z) + N_2(z)Q_2(z) + \qquad (6)$$

$$\left(\frac{g_1g_3 - g_4S_1(z)}{g_1g_2}\right)S_2(z)X(z) + \left(g_F C_F(z) - \left(\frac{g_4}{g_2}\right)S_2(z)\right)N_1(z)Q_1(z)$$

Therefore, it can be easily observed that output $Y(z)$ is a combination of the desired output $Y_{DES}(z)$, the input phase imbalance $Y_{PI}(z)$, and the quantization noise leakage $Y_{QNL}(z)$, which are as follows:

$$Y_{DES}(z) = \left(\frac{g_F}{g_1}\right)S_1(z)X(z)C_F(z) + N_2(z)Q_2(z) \qquad (7)$$

$$Y_{PI}(z) = \left(\frac{g_1g_3 - g_4S_1(z)}{g_1g_2}\right)S_2(z)X(z)$$

$$Y_{QNL}(z) = \left(g_F C_F(z) - \left(\frac{g_4}{g_2}\right)S_2(z)\right)N_1(z)Q_1(z)$$

Looking first to the quantization noise leakage $Y_{QNL}(z)$, this error is related to the gains $g_4$, $g_2$, and $g_F$ and transfer functions $C_F(z)$ and $S_2(z)$. If one were to set the ratio of gains $g_4$ and $g_2$ to be approximately equal to gain $g_F$ $$\left(\frac{g_4}{g_2} = g_F\right),$$

then a matching of the transfer functions $C_F(z)$ and $S_2(z)$ would result in elimination of this quantization noise leakage $Y_{QNL}(z)$. Since gain $g_F$ and $C_F(z)$ transfer function is adjustable (as being part of digital filter 206), adjustment can be based on determinations of the gains $g_4$ and $g_2$ and transfer function.

To determine the gains $g_4$ and $g_2$, DACs 204 and 408 can be selectively deactivated. Initially, a test signal (of any magnitude) can be applied to the CT SDM 200 with DAC 204 in a deactivated state and the gain $g_3$ set to 1 so that the output $Y_2(z)$ of CT SDM 212 can be measured. Under these circumstances, the gain $g_4$ is effectively 0, allowing equation (4) to be reduced to become output $Y_{2C1}(z)$ as follows:

$$Y_{2C1}(z) = \left(\frac{1}{g_2}\right)S_2(z)X(z) + N_2(z)Q_2(z) \qquad (8)$$

Then, the same test signal can be applied to CT SDM 212 with DAC 408 in a deactivated state and with DAC 204 as a feedback DAC for CT SDM 212. This changes the output $Y_2(z)$ to become output $Y_{2C2}(z)$ as follows:

$$Y_{2C2}(z) = \frac{1}{g_4}S_2(z)X(z) + N_2(z)Q_2(z) \qquad (9)$$

Each of outputs $Y_{2C1}(z)$ and $Y_{2C2}(z)$ can be measured. By dividing the outputs $Y_{2C1}(z)$ and $Y_{2C2}(z)$ and noting that for a small band-width around the signal of interest the term $N_2(z)Q_2(z)$ is negligible yields:

$$\frac{Y_{2C1}(z)}{Y_{2C2}(z)} = \frac{g_4}{g_2} \qquad (10)$$

Thus, a simple analysis of the system (which depends on the structures of the SDM filter 404) can yield the ratio $$\frac{g_4}{g_2}.$$

typically, CT SDM 212 can be a higher order modulator (i.e., greater than 3) so the SDM filter 404 be, accordingly, a higher order filter. Gain $g_F$ can then be adjusted to be proximately equal to the ratio $$\frac{g_4}{g_2}.$$

With gain $g_F$ set, the transfer function $C_F(z)$ can be adjusted to substantially match the transfer function $S_2(z)$. To do this, an error function E that is a cross-correlation of an output $Y_{1,N}(z)$ of digital filter and output $Y_2(z)$ of CT SDM 212 is used, where error function E is as follows:

$$E\{Y^{1,N}(k), Y_2(k)\} = (Y_{1,N} * Y_2)(k) = \Sigma \overline{Y}_{1,N}(i)Y_2(i+k) \qquad (11)$$

This error function E is maximized when the transfer functions $C_F(z)$ and $S_2(z)$ are matched. Thus, digital filter 206 can be adjusted until the error function E is substantially maximized. Additionally, because the $Q_1(z)$ are common terms between outputs $Y_{1,N}(z)$ and $Y_2(z)$, digital filter 206 can be blindly adjusted or calibrated.

Now, turning to the gain imbalance, the output $Y_2(z)$ is generally comprised shaped of Q-noise $Y_{2Q}(z)$ and phase/gain imbalance $Y_{2PI}(z)$, which are as follows:

$$Y_{2PI}(z) = X(z)\left(g_3 - \left(\frac{g_4}{g_2}\right)S_1(z)\right)\left(\frac{S_2(z)}{g_2}\right) \qquad (12)$$

-continued $$Y_{2Q}(z) = N_2(z)Q_2(z) - \left(\frac{g_4}{g_2}\right)S_2(z)N_1(z)Q_1(z)$$

Because there can be a delay associated with amplifier 220 and DAC 204, gains $g_3$ and $g_4$ can be represented as $g_3 A_d(z)$ and $g_4 D_d(z)$, and from equation (11) above, it is clear that the following condition should substantially eliminate the gain imbalance $Y_{2PI}(z)$:

$$g_3 A_d(z) - \left(\frac{g_4}{g_2}\right)D_d(z)S_1(z) = 0 \quad (13)$$

This would mean that the gain imbalance of $Y_{2PI}(z)$ would be substantially eliminated when the when the autocorrelation of $Y_2(z)$ (with gains $g_3$ and $g_4$ represented as $g_3 A_d(z)$ and $g_4 D_d(z)$) is approximately equal to zero. Thus, by adjusting delay 222 and the gain of amplifier 220, the gain imbalance $Y_{2PI}(z)$ cab be substantially eliminated.

Alternatively, the ratio $$\frac{g_4}{g_1}$$

can be determined by selectively deactivating DACs 204 and 408, similar to the method described above to determine the ratio $$\frac{g_4}{g_2}.$$

Initially, a test signal (of any magnitude) can be applied to the CT SDM 200 with DAC 204 in a deactivated state and the gain $g_3$ set to the ratio $$\frac{g_4}{g_1}$$

so that the output $Y_2(z)$ of CT SDM 212 can be measured. Under these circumstances, equation (4) can be reduced to become output $Y_{2D1}(z)$ as follows:

$$Y_{2D1}(z) = \left(\frac{1}{g_1}\right)S_2(z)X(z) + N_2(z)Q_2(z) \quad (14)$$

Then, the same test signal can be applied to CT SDM 212 with DAC 408 in a deactivated state and with DAC 204 as a feedback DAC for CT SDM 212. This changes the output $Y_2(z)$ to become output $Y_{2C2}(z)$ as denoted in equation (9) above. Each of outputs $Y_{2D1}(z)$ and $Y_{2C2}(z)$ can be measured. By dividing the outputs $Y_{2D1}(z)$ and $Y_{2C2}(z)$ and noting that, for a small band-width around the signal of interest, the term $N_2(z)Q_2(z)$ is negligible yields:

$$\frac{Y_{2D1}(z)}{Y_{2C2}(z)} = \frac{g_4}{g_1} \quad (15)$$

Thus, a simple analysis of the system (which depends on the structures of the SDM filter 404) can yield the ratio $$\frac{g_4}{g_1}.$$

Thus, by adjusting gain $g_3$ to be approximately equal to the ratio $$\frac{g_4}{g_1}$$

with this foreground calibration scheme (as opposed to the background scheme described above), gain imbalance can be substantially eliminated.

To generally eliminate phase imbalance, either a digital predictor 224 or digital predictor 224 with an analog delay line 222 can be employed. The tuning of either the digital predictor 220 or the analog delay line 222 can be done by minimizing the autocorrelation (similar to the scheme described above). For the digital predictor 220, for example, an analog delay line 222 can be introduced such that the delay through delay line 222 is greater than that through the CT SDM 202 so as to allow digital predictor 220 to be tuned such that the auto-correlation is minimized. Alternatively, an analog predictor 224 may be employed.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
a terminal;
an analog-to-digital converter (ADC) that is coupled to the terminal;
a first digital-to-analog converter (DAC) that is coupled to the ADC;
a first summing circuit that that is coupled to terminal and the first DAC, wherein the second summing circuit is configured to determine a difference;
a first gain circuit that is coupled to the first summing circuit summing circuit, wherein the first gain circuit has a first gain;
a continuous-time (CT) sigma-delta modulator (SDM) having:
a second summing circuit that is coupled to the first gain circuit, wherein the second summing circuit is configured to determine a difference;
an SDM filter that is coupled to the second summing circuit;
a quantizer that is coupled to the SDM filter; and
a second DAC that is coupled between the quantizer and the second summing circuit;
a second gain circuit that is coupled to the second quantizer, wherein the second gain circuit has a second gain, and wherein the second gain is substantially the inverse of the first gain, and wherein the first gain circuit, the CT SDM, and the DAC collectively have a first transfer function;
a filter that is coupled to the ADC and second gain circuit, wherein the digital filter has a second transfer function, wherein the second transfer function substantially matches the first transfer function,
wherein the first DAC has a third gain, and wherein the second DAC has a fourth gain, and wherein the filter has a fifth gain, and wherein the ratio of the third gain to the fourth gain is approximately equal to the fifth gain.

2. The apparatus of claim 1, wherein the filter further comprises:
a digital filter that is coupled to the ADC;
a third summing circuit that is coupled to the digital filter and the second gain circuit; and
an output circuit that is coupled to the third summing circuit.

3. The apparatus of claim 1, wherein the first gain circuit further comprises an amplifier with a filter.

4. The apparatus of claim 1, wherein the CT SDM further comprises a first CT SDM, and wherein the ADC further comprises a second CT SDM.

5. The apparatus of claim 4, wherein the SDM filter and quantizer further comprise a first SDM filter and a first quantizer, and wherein the second CT SDM further comprises:
a third summing circuit that is coupled to the terminal, wherein the third summing circuit is configured to determine a difference;
a second SDM filter that is coupled to the third summing circuit;
a second quantizer that is coupled to the second SDM filter; and
a third DAC that is coupled between the second quantizer and the third summing circuit.

6. The apparatus of claim 5, wherein the apparatus further comprises a third gain circuit that is coupled between terminal and the first summing circuit.

7. An apparatus comprising:
a terminal;
an ADC that is coupled to the terminal;
a first DAC that is coupled to the ADC;
a first gain circuit that is coupled to the terminal;
a first summing circuit that that is coupled to first gain circuit and the first DAC, wherein the second summing circuit is configured to determine a difference;
a second gain circuit that is coupled to the first summing circuit summing circuit, wherein the first gain circuit has a second gain;
a CT SDM having:
a second summing circuit that is coupled to the second gain circuit, wherein the second summing circuit is configured to determine a difference;
an SDM filter that is coupled to the second summing circuit;
a quantizer that is coupled to the SDM filter; and
a second DAC that is coupled between the quantizer and the second summing circuit, wherein the second DAC has a third gain;
a third gain circuit that is coupled to the second quantizer, wherein the second gain circuit has a fourth gain, and wherein the fourth gain is substantially the inverse of the second gain, and wherein the second gain circuit, the CT SDM, and the DAC collectively have a first transfer function;
a filter that is coupled to the ADC and third gain circuit, wherein the digital filter has a second transfer function and a fifth gain, wherein the second transfer function substantially matches the first transfer function.

8. The apparatus of claim 7, wherein the first DAC has a third gain, and wherein the second DAC has a fourth gain, and wherein the filter has a fifth gain, and wherein the ratio of the third gain to the fourth gain is approximately equal to the fifth gain.

9. The apparatus of claim 7, wherein the filter further comprises:
a digital filter that is coupled to the ADC;
a third summing circuit that is coupled to the digital filter and the second gain circuit; and
an output circuit that is coupled to the third summing circuit.

10. The apparatus of claim 7, wherein the first and second gain circuits further first and second amplifiers, respectively.

11. The apparatus of claim 9, wherein the CT SDM further comprises a first CT SDM, and wherein the ADC further comprises a second CT SDM.

12. The apparatus of claim 11, wherein the SDM filter and quantizer further comprise a first SDM filter and a first quantizer, and wherein the second CT SDM further comprises:
a third summing circuit that is coupled to the terminal, wherein the third summing circuit is configured to determine a difference;
a second SDM filter that is coupled to the third summing circuit;
a second quantizer that is coupled to the second SDM filter; and
a third DAC that is coupled between the second quantizer and the third summing circuit.

13. An apparatus comprising:
a terminal;
an ADC that is coupled to the terminal;
a predictor that is coupled to the ADC;
a first DAC that is coupled to the ADC;
a first summing circuit that that is coupled to terminal and the first DAC, wherein the second summing circuit is configured to determine a difference;
a first gain circuit that is coupled to the first summing circuit summing circuit, wherein the first gain circuit has a first gain;
a CT SDM having:
a second summing circuit that is coupled to the first gain circuit, wherein the second summing circuit is configured to determine a difference;
an SDM filter that is coupled to the second summing circuit;
a quantizer that is coupled to the SDM filter; and
a second DAC that is coupled between the quantizer and the second summing circuit;
a second gain circuit that is coupled to the second quantizer, wherein the second gain circuit has a second gain, and wherein the second gain is substantially the inverse of the first gain, and wherein the first gain circuit, the CT SDM, and the DAC collectively have a first transfer function;
a filter that is coupled to the ADC and second gain circuit, wherein the digital filter has a second transfer function, wherein the second transfer function substantially matches the first transfer function.

14. The apparatus of claim 13, wherein the filter further comprises:
a digital filter that is coupled to the ADC;
a third summing circuit that is coupled to the digital filter and the second gain circuit; and an output circuit that is coupled to the third summing circuit.

15. The apparatus of claim 13, wherein the predictor further comprises an analog predictor that is coupled between the terminal and the ADC.

16. The apparatus of claim 13, wherein the predictor further comprises a digital predictor that is coupled between the ADC and the first DAC, and wherein the apparatus further comprises a delay line that is coupled between the terminal and the first summing circuit.

17. The apparatus of claim 13, wherein the CT SDM further comprises a first CT SDM, and wherein the ADC further comprises a second CT SDM.

18. The apparatus of claim 17, wherein the SDM filter and quantizer further comprise a first SDM filter and a first quantizer, and wherein the second CT SDM further comprises:
- a third summing circuit that is coupled to the terminal, wherein the third summing circuit is configured to determine a difference;
- a second SDM filter that is coupled to the third summing circuit;
- a second quantizer that is coupled to the second SDM filter; and
- a third DAC that is coupled between the second quantizer and the third summing circuit.

19. The apparatus of claim 13, wherein the apparatus further comprises a third gain circuit that is coupled between terminal and the first summing circuit.

\* \* \* \* \*